(12) United States Patent
Matsubara et al.

(10) Patent No.: US 6,978,409 B2
(45) Date of Patent: Dec. 20, 2005

(54) INTEGRATED CIRCUIT AND TESTING METHOD FOR INTEGRATED CIRCUIT

(75) Inventors: Takayuki Matsubara, Osaka (JP); Akimitsu Shimamura, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 498 days.

(21) Appl. No.: 10/067,819

(22) Filed: Feb. 8, 2002

(65) Prior Publication Data

US 2002/0170008 A1    Nov. 14, 2002

(30) Foreign Application Priority Data

May 8, 2001    (JP)    ............................... 2001-136938

(51) Int. Cl.⁷ ........................................... G01R 31/28
(52) U.S. Cl. ...................... 714/724; 324/765
(58) Field of Search .................. 714/724, 725, 714/726, 733, 738, 745; 324/765, 763; 326/16; 365/201

(56) References Cited

U.S. PATENT DOCUMENTS 5,459,737 A * 10/1995 Andrews .................... 714/733
6,134,688 A    10/2000 Sachdev ..................... 714/727

* cited by examiner

*Primary Examiner*—Albert Decady
*Assistant Examiner*—James C. Kerveros
(74) *Attorney, Agent, or Firm*—McDermott Will & Emery LLP

(57) ABSTRACT

In testing of a plurality of logic circuits having the same function and included in an integrated circuit, an address decoder makes two logic circuits having the same function simultaneously operate in response to an address signal. Try state buffers enter an enable state in response to a testing mode signal. Accordingly, the outputs of the two logic circuits are output to a signal line through the try state buffers. When the two logic circuits are both nondefective, a supply current cannot be measured by a current measuring unit, but when one of the logic circuits is defective, an excessive supply current is measured by the current measuring unit, and hence, it can be determined that one of them is defective. Accordingly, a plurality of logic circuits can be simultaneously found defective or nondefective by the IDDQ testing, resulting in reducing time required for the testing.

5 Claims, 2 Drawing Sheets

INTEGRATED CIRCUIT AND TESTING METHOD FOR INTEGRATED CIRCUIT

BACKGROUND OF THE INVENTION

The present invention relates to an integrated circuit and a testing method for an integrated circuit.

FIG. 2 shows the entire configuration of a conventional integrated circuit. In FIG. 2, a reference numeral 14 denotes a CPU and a reference numeral 13 denotes an integrated circuit, which includes an address decoder 10, a first logic circuit 11 and a second logic circuit 12 having the same function as the first logic circuit 11.

The first logic circuit 11 has one or more logic functions and includes a register 11a to which an arbitrary address is previously allocated, so that it can work as an adder when the value stored in the register 11a is "0" and work as a subtracter when the value is "1". When an address signal s200a corresponding to the register 11a is output from the CPU 14, the address decoder 10 decodes the address signal s200a so as to output a first address select signal (enable signal) s11 to the register 11a. The register 11a receives a data signal s200b output from the CPU 14 and is set to the value of the data signal s200b, so that the first logic circuit 11 can perform the operation defined by the register 11a and output the result to a signal line s11a. The first logic circuit 11 can be tested by monitoring the value of this output on the signal line s11a.

Similarly, the second logic circuit 12 has the same function as the first logic circuit 11, and includes a register 12a to which an arbitrary address different from that of the register 11a of the first logic circuit 11 is previously allocated, so that the second logic circuit 12 can work as an adder when the value stored in the register 12a is "0" and work as a subtracter when the value is "1". When the CPU 14 outputs an address signal s200a corresponding to the register 12a, the address decoder 10 decodes the address signal s200a so as to output an address select signal (enable signal) s12 to the register 12a. The register 12a of the second logic circuit 12 is set to the value of a data signal s200b output from the CPU 14. The second logic circuit 12 performs the operation defined by the register 12a and outputs the result to a signal line s12a. The second logic circuit 2 can be tested by monitoring the value of this output on the signal line s12a.

In this manner, in the conventional testing method, all logic circuits included in an integrated circuit to be tested are made to perform a normal operation repeatedly one by one so as to monitor the output values of the respective logic circuits.

Recently, in accordance with the increased degree of integration of LSIs, a logic circuit is used as a highly general-purpose IP (intellectual property) in fabrication of an LSI in order to improve the design efficiency.

However, when an integrated circuit including a plurality of logic circuits having the same function as in the aforementioned conventional integrated circuit is tested, it is necessary to successively test the respective logic circuits one by one, which disadvantageously requires a long time for the testing.

Furthermore, when a configuration for enabling simultaneous testing of a plurality of logic circuits is employed, there arises a problem that a large number of test pins are necessary for externally monitoring output signals of the respective logic circuits.

SUMMARY OF THE INVENTION

An object of the invention is reducing time required for testing by simultaneously testing logic circuits having the same function. In addition, another object of the invention is providing a configuration of an integrated circuit capable of being tested without using a test pin.

In order to achieve the objects, the testing method of this invention utilizes the IDDQ testing, namely, a test using correlation exhibited between the presence of a physical defect in a circuit and a rise of a supply current of the circuit in a steady state (IDD quiescent current), so that circuit blocks having the same function can be simultaneously tested.

Specifically the integrated circuit of this invention includes at least two logic circuits including a first logic circuit and a second logic circuit having the same function as the first logic circuit; and a direction circuit for directing operation or halt of the first and second logic circuits, and the direction circuit directs, in normal mode, the operation of one of the first and second logic circuits based on an externally supplied select signal, and directs, in testing mode, simultaneous operation of the first and second logic circuits when the select signal is a signal for selecting the first or second logic circuit.

The integrated circuit of this invention preferably further includes a first output circuit for receiving an output of the first logic circuit; a second output circuit for receiving an output of the second logic circuit; and a signal line for transferring both the outputs of the first and second output circuits, and the first and second output circuits enter an enable state in response to an externally supplied testing mode signal.

Furthermore, in the integrated circuit of this invention, each of the first and second logic circuits preferably performs a logic operation corresponding to a function according to an externally supplied function signal when the operation thereof is directed by the direction circuit.

The testing method of this invention for an integrated circuit composed of at least two logic circuits including a first logic circuit and a second logic circuit having the same function as the first logic circuit, includes the steps of simultaneously operating the first and second logic circuits; transferring outputs of the first and second logic circuits to one signal line; measuring a value of a supply current flowing through the signal line; and determining whether the first and second logic circuits are defective or nondefective based on the measured value of the supply current.

Therefore, according to the invention, both the two logic circuits having the same function are directed by the direction circuit to simultaneously operate in the testing mode, and hence, testing time can be reduced owing to the simultaneous operation. In particular, when an integrated circuit to be tested includes three or more logic circuits having the same function, the effect to reduce the testing time is remarkably exhibited.

Furthermore, according to the invention, the outputs of the two logic circuits simultaneously operated in the testing mode are output through the first and second output circuits to one signal line. Each of the first and second output circuits is provided with an H level supply source and an L level supply source, so that the H level supply source can be connected to the signal line when the output of the corresponding logic circuit is at an H level and that the L level supply source can be connected to the signal line when the output is at an L level. Accordingly, in the case where the simultaneously operated two logic circuits are both nondefective and their outputs have the same value, the H level supply source of one output circuit and the L level supply source of the other output circuit are not short-circuited, resulting in allowing no current to flow through the signal line. On the other hand, in the case where one of the logic circuits is defective, the short-circuit is caused, resulting in allowing an excessive current to flow through the signal line. As a result, it can be determined whether the logic circuits are defective or nondefective by measuring the current flowing through the signal line. Accordingly, internal circuits of an integrated circuit can be tested without providing test pins as in the conventional technique.

DETAILED DESCRIPTION OF THE INVENTION

A preferred embodiment of the invention will now be described with reference to the accompanying drawing.

Figure 1:
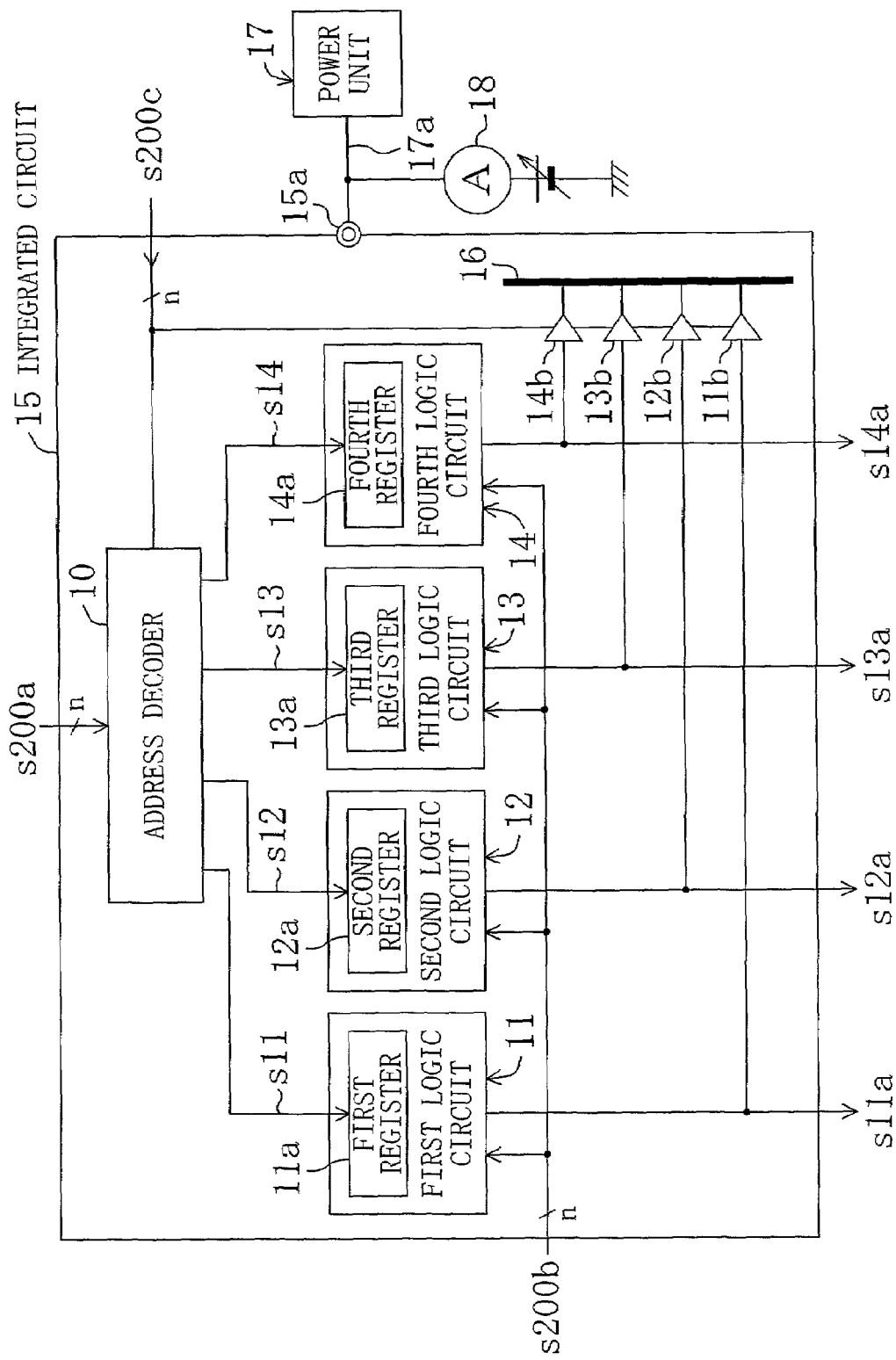
FIG. 1 is a block diagram for showing the entire configuration of an integrated circuit according to an embodiment of the invention.
Figure 2:
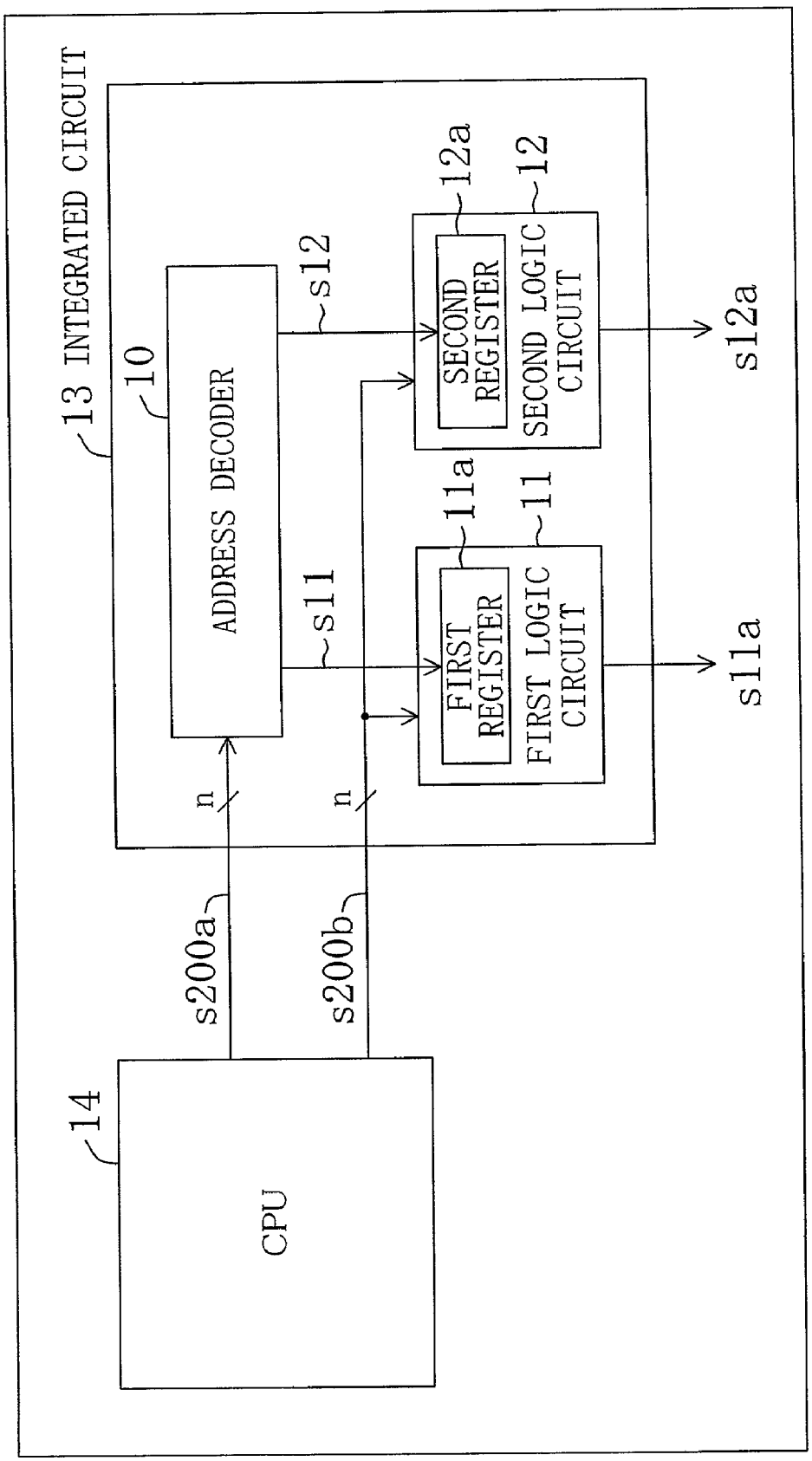
FIG. 2 is a block diagram for showing the entire configuration of a conventional integrated circuit.

FIG. 1 is a block diagram of an integrated circuit according to the embodiment of the invention. In FIG. 1, a reference numeral 15 denotes an integrated circuit, which includes an address decoder 10, a first logic circuit 11, a second logic circuit 12 having the same function as the first logic circuit 11, a third logic circuit 13 and a fourth logic circuit 14. The third and fourth logic circuits 13 and 14 have the same function, which is different from the function of the first and second logic circuits 11 and 12.

Also, the integrated circuit 15 includes first, second, third and fourth try state buffers 11b, 12b, 13b and 14b. The try state buffers 11b through 14b are respectively connected to output signal lines s11a through s14a of the first through fourth logic circuits 11 through 14 at their inputs and are commonly connected to a separately provided signal line 16 at their outputs. Although not shown in the drawing, each of the try state buffers 11b through 14b is provided with an H level supply source for outputting an H level signal and an L level supply source for outputting an L level signal.

A reference numeral 17 denotes a power unit for supplying power to the integrated circuit 15. A current measuring unit 18 is connected to a supply line 17a extending from the power unit 17 to a supply terminal 15a of the integrated circuit 15, so as to measure a current flowing through the supply line 17a. The signal line 16 is connected to the supply line 17a through a variety of paths not shown.

In normal mode in which the integrated circuit 15 performs the normal operation, a testing mode signal s200c input to the address decoder 10 is fixed to "00", in first testing mode in which the first and second logic circuits 11 and 12 are tested, the testing mode signal s200c is fixed to "01", and in second testing mode in which the third and fourth logic circuits 13 and 14 are tested, the testing mode signal s200c is fixed to "10".

The first logic circuit 11 has a register 11a to which an arbitrary address is previously allocated, so that it can work as, for example, an adder when the value stored in the register 11a is "0" and work as, for example, a subtracter when the value is "1". In the normal mode, when an address signal (select signal) s200a corresponding to the register 11a is input to the integrated circuit 15, the address decoder (direction circuit) 10 decodes the address signal s200a, so as to output a first address select signal (enable signal) s11 alone for directing the operation of the first logic circuit 11 alone and directing halt of the second through fourth logic circuits 12 through 14. In the thus operated first logic circuit 11, the register 11a having received the enable signal s11 is set to the value of an input data signal (function signal) s200b. When the set value is "0", the first logic circuit 11 works as an adder, so as to output the result to the signal line s11a. When the set value is "1", the first logic circuit 11 works as a subtracter, so as to output the result to the signal line s11a. At this point, the data on the signal line s11a is also input to the try state buffer 11b, but the signal line 16 is in a high impedance state because the testing mode signal s200c is at the L level.

Similarly, the second logic circuit 12 includes a register 12a to which an arbitrary address different from that of the register 11a of the first logic circuit 11 is previously allocated, so as to have the same function as the first logic circuit 11. In the normal mode, when an address signal s200a corresponding to the register 12a is input, the address decoder 10 decodes the address signal s200a, so as to output an address select signal (enable signal) s12 alone for directing the operation of the second logic circuit 12 alone. The register signal 12a having received the enable signal s12 is set to the value of an input data signal s200b. When the set value is "0", the second logic circuit 12 works as an adder so as to output the result to the signal line sl2a. When the set value is "1", the second logic circuit 12 works as a subtracter, so as to output the result to the signal line s12a. At this point, the data on the signal line s12a is also input to the try state buffer 12b, but the signal line 16 is in a high impedance state because the testing mode signal s200c is at the L level.

On the other hand, in the first testing mode of the integrated circuit 15, when an address signal s200a corresponding to the register 11a or 12a of the first or second logic circuit 11 or 12 is input, the address decoder 10 decodes the address signal s200a, so as to output both the two address select signals (enable signals) s11 and s12 for directing the simultaneous operation of the first and second logic circuits 11 and 12. In the thus simultaneously operated two logic circuits 11 and 12, the registers 11a and 12a are set to the value of an input data signal s200b, and hence, the first logic circuit 11 and the second logic circuit 12 simultaneously work as the same adder or subtracter.

The first try state buffer (first output circuit) 11b and the second try state buffer (second output circuit) 12b enter an enable state in response to the testing mode signal s200c having the value "01", so as to output the data on the two signal lines s11a and sl2a to the signal line 16. When the first logic circuit 11 and the second logic circuit 12 are both nondefective, signals having the same value are input to the two signal lines s11a and s12a. Therefore, the H level supply source and the L level supply source are not short-circuited between the try state buffers 11b and 12b of the logic circuits 11 and 12, and hence, no supply current flows through the signal line 16 and the supply line 17a.

Alternatively, when, for example, the first logic circuit 11 is nondefective and the second logic circuit 12 is defective, signal values on the signal lines s11a and s12a are different from each other. Therefore, the H level supply source and the L level supply source are short-circuited between the two try state buffers 11b and 12b through the signal line 16, and hence, an excessive supply current flows through the signal line 16 and the supply line 17a. Accordingly, when the IDDQ testing is carried out by monitoring the supply current flowing through the supply line 17a with the current measuring unit 18, it can be determined whether the first and second logic circuits 11 and 12 of the integrated circuit 15 are defective or nondefective.

Although the testing method for the first and second logic circuits 11 and 12 alone is herein described, the testing for the other logic circuits 13 and 14 having the same operation function can be carried out in the same manner. Therefore, when the IDDQ testing is carried out with the logic circuits 13 and 14 simultaneously operated in the second testing mode and the supply current flowing through the supply line 17a is measured with the current measuring unit 18, it can be determined whether the third and fourth logic circuits 13 and 14 are defective or nondefective.

It goes without saying that an existing bus can be used as the signal line 16 although it is separately provided in this embodiment.

What is claimed is:

1. An integrated circuit comprising:
    at least two logic circuits including a first logic circuit and a second logic circuit having the same function as said first logic circuit;
    a direction circuit for directing operation or halt of said first and second logic circuits;
    a first output circuit for receiving an output of said first logic circuit;
    a second output circuit for receiving an output of said second logic circuit; and
    one signal line for simultaneously receiving both the outputs of said first and second output circuits,
    wherein said direction circuit directs, in normal mode, the operation of one of said first and second logic circuits based on an externally supplied select signal, and directs, in testing mode, simultaneous operation of said first and second logic circuits when said select signal is a signal for selecting said first or second logic circuit, and
    wherein said first and second output circuits enter an enable state in response to an externally supplied testing mode signal.

2. The integrated circuit of claim 1, wherein each of said first and second logic circuits performs a logic operation corresponding to a function according to an externally supplied function signal when the operation thereof is directed by said direction circuit.

3. A testing method for an integrated circuit composed of:
    at least two logic circuits including a first logic circuit and a second logic circuit having the same function as said first logic circuit;
    a first output circuit for receiving an output of said first logic circuit;
    a second output circuit for receiving an output of said second logic circuit; and
    one signal line for simultaneously receiving both the outputs of said first and second output circuits,
    said method comprising the steps of:
    simultaneously operating said first and second logic circuits;
    transferring outputs of said first and second logic circuits to said one signal line;
    measuring a supply current flowing through said one signal line; and
    determining whether said first and second logic circuits are defective or nondefective based on said measured supply current.

4. The integrated circuit of claim 1, wherein the direction circuit is connected to said at least two logic circuits.

5. The integrated circuit of claim 1, further comprising a current measuring unit, wherein the outputs of the first and second logic circuits are transferred to one signal line, and wherein said current measuring unit measures a supply current flowing through the signal line to determine whether the first and second logic circuits are defective or nondefective.

* * * * *